(12) United States Patent
Barlett et al.

(10) Patent No.: US 8,786,841 B2
(45) Date of Patent: Jul. 22, 2014

(54) THIN FILM TEMPERATURE MEASUREMENT USING OPTICAL ABSORPTION EDGE WAVELENGTH

(75) Inventors: Darryl Barlett, Dexter, MI (US); Charles A. Taylor, II, Ann Arbor, MI (US); Barry D. Wissman, Ann Arbor, MI (US)

(73) Assignee: k-Space Associates, Inc., Dexter, MI (US)

( * ) Notice: Subject to any disclaimer, the term of this patent is extended or adjusted under 35 U.S.C. 154(b) by 267 days.

(21) Appl. No.: 13/378,788

(22) PCT Filed: Jun. 21, 2010

(86) PCT No.: PCT/US2010/039321
§ 371 (c)(1),
(2), (4) Date: Jan. 12, 2012

(87) PCT Pub. No.: WO2010/148385
PCT Pub. Date: Dec. 23, 2010

(65) Prior Publication Data
US 2012/0133934 A1 May 31, 2012

Related U.S. Application Data

(60) Provisional application No. 61/218,523, filed on Jun. 19, 2009.

(51) Int. Cl.
*G01N 21/00* (2006.01)
*G01N 21/47* (2006.01)

(52) U.S. Cl.
USPC .............................................. 356/72; 356/446

(58) Field of Classification Search
USPC ............ 374/161; 356/326, 504, 72, 446
See application file for complete search history.

(56) References Cited

U.S. PATENT DOCUMENTS

| | | | | |
|---|---|---|---|---|
| 4,136,566 A | * | 1/1979 | Christensen | 374/161 |
| 4,437,761 A | * | 3/1984 | Kroger et al. | 356/44 |
| 4,890,933 A | * | 1/1990 | Amith et al. | 374/121 |
| 5,098,199 A | * | 3/1992 | Amith | 374/121 |
| 5,118,200 A | * | 6/1992 | Kirillov et al. | 374/120 |
| 5,167,452 A | * | 12/1992 | Amith et al. | 374/121 |
| 5,388,909 A | * | 2/1995 | Johnson et al. | 374/161 |

(Continued)

FOREIGN PATENT DOCUMENTS

| | | |
|---|---|---|
| JP | 6043034 A | 2/1994 |
| JP | 06043034 A | 2/1994 |

*Primary Examiner* — Gregory J Toatley
*Assistant Examiner* — Shawn Decenzo
(74) *Attorney, Agent, or Firm* — Endurance Law Group, PLC

(57) ABSTRACT

A technique for determining the temperature of a sample including a semiconductor film 20 having a measurable optical absorption edge deposited on a transparent substrate 22 of material having no measurable optical absorption edge, such as a GaN film 20 deposited on an Al2O3 substrate 22 for blue and white LEDs. The temperature is determined in realtime as the film 20 grows and increases in thickness. A spectra based on the diffusely scattered light from the film 20 is produced at each incremental thickness. A reference division is performed on each spectra to correct for equipment artifacts. The thickness of the film 20 and an optical absorption edge wavelength value are determined from the spectra. The temperature of the film 20 is determined as a function of the optical absorption edge wavelength and the thickness of the film 20 using the spectra, a thickness calibration table, and a temperature calibration table.

22 Claims, 14 Drawing Sheets

(56) References Cited

U.S. PATENT DOCUMENTS

| | | | |
|---|---|---|---|
| 5,568,978 A | 10/1996 | Johnson et al. | |
| 5,683,180 A * | 11/1997 | De Lyon et al. | 374/161 |
| 5,703,689 A * | 12/1997 | Powell | 356/432 |
| 5,769,540 A * | 6/1998 | Schietinger et al. | 374/127 |
| 6,082,892 A | 7/2000 | Adel et al. | |
| 6,116,779 A * | 9/2000 | Johnson et al. | 374/161 |
| 6,174,081 B1 * | 1/2001 | Holm | 374/161 |
| 6,826,511 B2 * | 11/2004 | Mikkelsen et al. | 702/172 |
| 7,543,981 B2 * | 6/2009 | Timans | 374/129 |
| 7,800,753 B1 * | 9/2010 | Hug et al. | 356/317 |
| 7,976,216 B2 * | 7/2011 | Timans | 374/45 |
| 8,157,439 B2 * | 4/2012 | Timans | 374/129 |
| 2005/0106876 A1 | 5/2005 | Taylor et al. | |
| 2012/0021539 A1 * | 1/2012 | Allenic et al. | 438/7 |

* cited by examiner

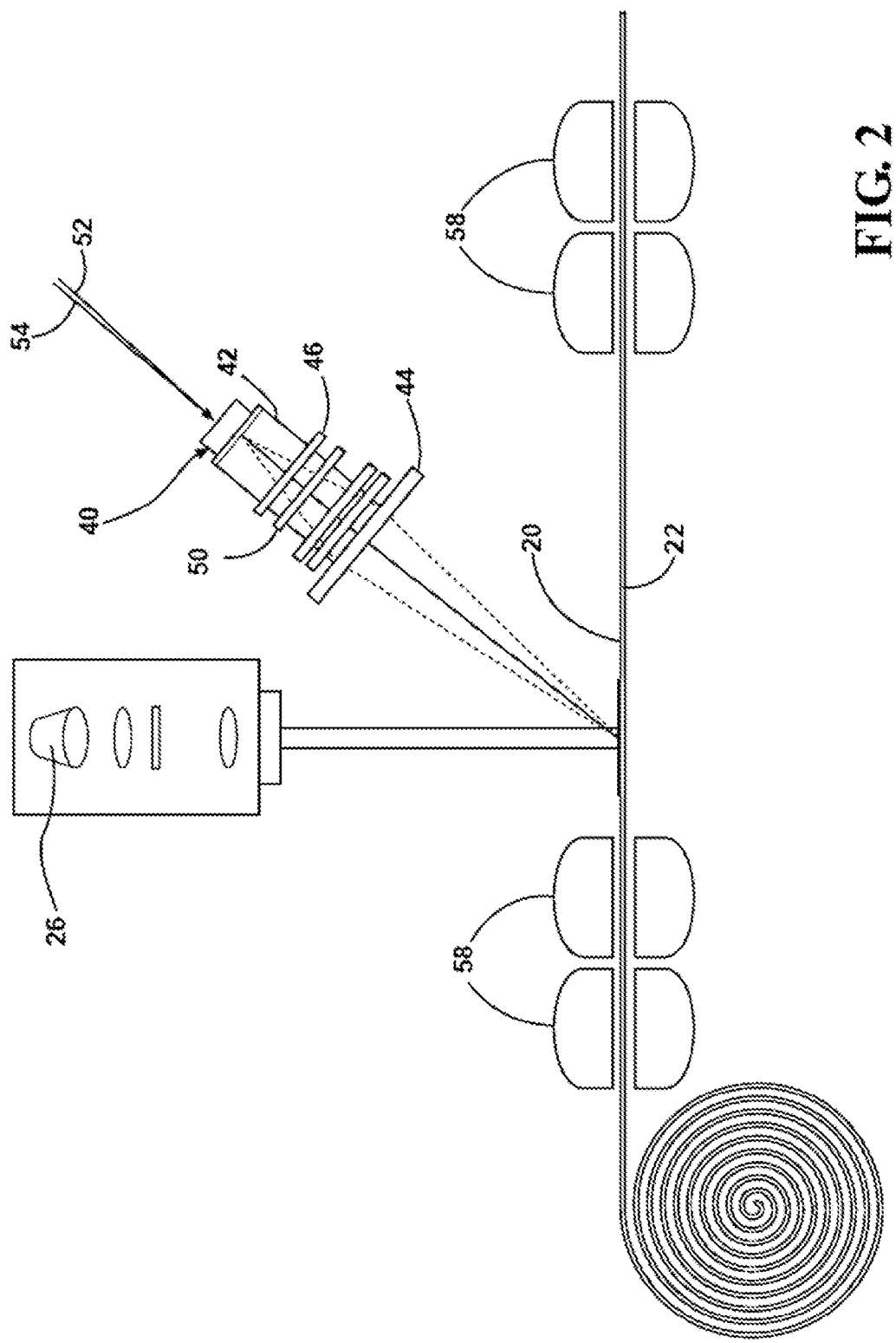

Substrate Material

File | Material Identifier | Fit

Material: GaN

Revisions: 1

Attributes

Thickness (um): 3.2

Carrier conc. (cm^-3):

Polish: SSP

Resistivity (ohm-cm):

Conductivity: Unknown

Absorption mode: reflection

Dopant:

Manufacturer:

Cal. Film Thickness (um): 3.2

Comments: 3.2um GaN Film on Sapphire

[ OK ]  [ Cancel ]  [ Apply ]  [ Help ]

THIN FILM TEMPERATURE MEASUREMENT USING OPTICAL ABSORPTION EDGE WAVELENGTH

CROSS REFERENCE TO RELATED APPLICATIONS

This application claims priority to Provisional Patent Application No. 61/218,523, filed Jun. 19, 2009, the entire disclosures of which is hereby incorporated by reference and relied upon.

BACKGROUND OF THE INVENTION

1. Field of the Invention

The invention relates generally to methods for making precise non-contact measurements of substrate and thin film temperature during growth and processing of the thin film on the substrate.

2. Related Art

Advanced manufacturing processes involving depositing thin films on substrates often depend on the ability to monitor and control a property of the substrate, such as temperature, with high precision and repeatability.

For many applications, precise temperature measurement during the growth of a thin film on a semiconductor wafer or substrate is critical to the ultimate quality of the finished, coated wafer and in turn to the performance of the opto-electronic devices constructed on the wafer. Variations in substrate temperature, including intra-wafer variations in temperature ultimately affect quality and composition of the layers of material deposited. During the deposition process, the substrate wafer is heated from behind and rotated about a center axis. Typically, a resistance heater positioned in proximity to the wafer provides the heat source for elevating the temperature of the wafer to a predetermined value.

An example application illustrating the necessity of precise temperature control is the formation of semiconductor nanostructures. Semiconductor nanostructures are becoming increasingly important for applications such as "quantum dot" detectors, which require the self-assembled growth of an array of very uniform sizes of nano-crystallites. This can only be accomplished in a very narrow window of temperature. Temperature uncertainties can result in spreading of the size distribution of the quantum dots, which is detrimental to the efficiency of the detector.

The growth of uniform quantum dots is an example of a thermally activated process in which the diffusion rates are exponential in temperature. Therefore, it is important to be able to measure, and have precise control over, the substrate temperature when growth or processing is performed.

Numerous methods have been disclosed for monitoring these temperatures. One simple, but largely ineffective approach has been the use of conventional thermocouples placed in proximity to, or in direct contact with the substrate during the thin film growth operation. This methodology is deficient in many respects, most notably, the slow response of typical thermocouples, the tendency of thermocouples (as well as other objects within the deposition chamber) to become coated with the same material being deposited on the semiconductor wafer, thereby affecting the accuracy of the thermocouple, as well as the spot thermal distortion of the surface of the semiconductor wafer resulting from physical contact between the thermocouple and the substrate. In any event, the use of thermocouples near or in contact with the substrate is largely unacceptable during most processes because of the poor accuracy achieved.

Optical pyrometry methods have been developed to overcome these shortcomings. Optical pyrometry uses the emitted thermal radiation, often referred to as "black body radiation," to measure the sample temperature. The principal difficulties with this method are that samples typically do not emit sufficient amounts of thermal radiation until they are above approximately 450° C., and semiconductor wafers are not true black body radiators. Furthermore, during deposition a semiconductor wafer has an emissivity that varies significantly both in time and with wavelength. Hence, the use of pyrometric instruments is limited to high temperatures and the technique is known to be prone to measurement error.

In "A New Optical Temperature Measurement Technique for Semiconductor Substrates in Molecular Beam Epitaxy," Weilmeier et al. describe a technique for measuring the diffuse reflectivity of a substrate having a textured back surface, and inferring the temperature of the semiconductor from the band gap characteristics of the reflected light. The technique is based on a simple principle of solid state physics, namely the practically linear dependence of the interband optical absorption (Urbach) edge on temperature.

Briefly, a sudden onset of strong absorption occurs when the photon energy, hv, exceeds the band gap energy $E_g$. This is described by an absorption coefficient:

$$\alpha(h\nu) = \alpha_g \exp[(h\nu - E_g)/E_0],$$

where $\alpha_g$ is the optical absorption coefficient at the band gap energy. The absorption edge is characterized by $E_g$ and another parameter, $E_0$, which is the broadening of the edge resulting from the Fermi-Dirac statistical distribution (the broadening $\sim k_B T$ at the temperatures of interest here). The key quantity of interest, $E_g$, is given by the Einstein model in which the phonons are approximated to have a single characteristic energy $k_B \theta_E$. The effect of phonon excitations (i.e. thermal vibrations) is to reduce the band gap according to:

$$E_g(T) = E_g(0) - S_g k_B \theta_E \left[ \frac{1}{\exp(\theta_E/T) - 1} \right],$$

Where $S_g$ is a temperature-independent coupling constant and $\theta_E$ is the Einstein temperature. In the case where $T \gg \theta_E$, which is well-obeyed for high-modulus materials like Si and GaAs, one can approximate the temperature dependence of the band gap by the equation:

$$E_g(T) = E_g(0) - S_g k_B T,$$

showing that $E_g$ is expected to decrease linearly with temperature T with a slope determined by $S_g k_B$. This is well obeyed in practice and is the basis for band edge thermometry.

Variations on this methodology are taught by Johnson et al., in U.S. Pat. No. 5,388,909, and U.S. Pat. No. 5,568,978. These references teach the utilization of the filtered output of a wide spectrum halogen lamp which is passed through a mechanical chopper, then passed through a lens, then through the window of the high vacuum chamber in which the substrate is located, and in which the thin film deposition process is ongoing. Located within the chamber is a first mirror which directs the output of the source to the surface of the substrate. The substrate is being heated by a filament or a similar heater which raises the temperature of the substrate to the optimum level required for effective operation of the deposition process. A second mirror located within the chamber is positioned to reflect the non-specular (i.e., diffuse) light reflected from the back surface of the substrate, said reflection being directed to another window in the chamber and thence through a lens to a detection system comprising a spectrometer. The wavelengths of the elements of the non-specular reflection are utilized to determine the band gap corresponding to a particular temperature. Johnson et al. teach that the temperature is determined from the "knee" in the graph of the diffuse reflectance spectrum near the band gap.

While this prior art technique is in some ways effective, use of optical fiber bundles, intra-chamber optics, mechanical light choppers and mechanically scanned spectrometers renders the methodology deficient in many respects. The detected signal suffers from temporal degradation of the optics within the deposition chamber. The mechanical components are overly susceptible to failure and the overall methodology of collecting the signal is simply too slow for real-time measurement and control applications in the industrial production environment. In addition, the described means of the prior art is subject to variations in accuracy dependent upon the fluctuation, over time, of the output of the halogen light source.

Specifically, this prior art relies on one or more optical elements within the deposition chamber to direct the incident light to the wafer and to collect the diffusely reflected light. The presence of optics within the deposition chamber is problematic, since the material being deposited during the coating process tends to coat all of the contents of the chamber, including the mirrors, lenses, etc. Over time the coatings build up and significantly reduce the collection efficiency of the optics and can lead to erroneous temperature measurement.

More importantly, this prior art technique relies on a mechanical light chopper and a mechanical scanning spectrometer for measurement of the light signal. Not only do the mechanical components fail frequently with extended use, but it is well known that gears in scanning spectrometers wear, resulting in continual shifts in the wavelength calibration. This leads to perpetually increasing errors in temperature measurement unless the instrument is recalibrated frequently, which is a very time-consuming process. In addition, it is well known that scanning spectrometers are quite slow, requiring anywhere from 1-5 seconds to complete a single scan. In most deposition systems the semiconductor wafers are rotating, typically at 10-30 RPM. In this case, a temperature measurement that takes 1-5 seconds to complete is by default an average temperature and it is impossible to make any type of spatially resolved measurement. If the process chamber has many wafers rotating on a platter about a common axis, as is typical in a production deposition system, the slow response time of the prior art makes it impossible to monitor multiple wafers.

Furthermore, the prior art utilizes a quartz halogen light source with no consideration of any type of output stabilization or intensity control. Quartz halogen lamps are known to degrade rapidly over time leading to fluctuations in the lamp output that result in measurement variations and further system downtime for lamp replacement.

As alluded to above, control of the temperature or another property associated with the process is best achieved through precise and real-time monitoring of the substrate temperature or property. The BandiT™ system from k-Space Associates, Inc., Dexter Mich., USA (kSA), assignee of the subject invention, has emerged as a premier, state-of-the-art method and apparatus for measuring semiconductor substrate temperature. The kSA BandiT is a non-contact, noninvasive, real-time, absolute wafer temperature sensor. The kSA BandiT system provides a viable solution for low-temperature wafer monitoring where pyrometers cannot measure. The kSA BandiT system is also insensitive to changing viewport transmission, stray light sources, and signal contribution from substrate heaters. Diffusely scattered light from the wafer is detected to measure the optical absorption edge wavelength. From the optical absorption edge wavelength the temperature is accurately determined. The kSA BandiT can run in two modes: 1) transmission mode, whereby the substrate heater is used as the light source and a single detector port is required, and 2) reflection mode, whereby the BandiT light source is mounted on one port, and the BandiT detector unit is mounted on a 2nd, non-specular port. The kSA BandiT is available in two models covering the spectral range 380 nm-1700 nm. Dual spectrometer units are also available for applications requiring the full spectral range. Typical sample materials measured and monitored include GaAs, Si, SiC, InP, ZnSe, ZnTe, and GaN. The kSA BandiT system is described in detail in US Publication No. 2005/0106876 and U.S. Publication No. 2009/0177432 the entire disclosures of which are incorporated here by reference.

Despite the widespread success of the kSA BandiT system, new applications are emerging in which it is difficult to measure properties of the substrate, such as temperature, due to the non-semiconductor properties of the substrate material. These non-semi-conductor materials do not have a measurable optical absorption edge and are typically transparent to all practical wavelengths of light. For example, blue and white light emitting diodes (LEDs) are manufactured by depositing Gallium Nitride (GaN) onto a sapphire ($Al_2O_3$) or amorphous SiC substrate, which does not have a measurable optical absorption edge. Accordingly, the prior art temperature measuring techniques may not be viable in certain limited applications.

SUMMARY OF THE INVENTION

One aspect of the invention provides a method for determining a temperature of a semiconductor film having a measurable optical absorption edge deposited on a substrate having no measurable optical absorption edge. The method comprises the steps of providing the substrate material having no measurable optical absorption edge and depositing the film of a semiconductor material having a measurable optical absorption edge and a measurable thickness on the substrate. The method also includes interacting light with the film deposited on the substrate to produce diffusely scattered light. The method further includes collecting the diffusely scattered light from the film and producing a spectra indicating optical absorption of the film based on the diffusely scattered light from the film. The method also includes determining a thickness of the film. The method further includes determining the optical absorption edge wavelength of the film, and determining the temperature of the film at the film thickness as a function of the film thickness and the optical absorption edge wavelength.

Another aspect of the invention provides an apparatus for determining the optical absorption edge of a semiconductor film having a measurable optical absorption edge deposited on a substrate having no measurable optical absorption edge. The apparatus includes a detector for collecting diffusely scattered light from the film and a spectrometer for producing a spectra from the diffusely scattered light. The apparatus further includes a software program for determining a temperature of the film at the film thickness as a function of the film thickness and the optical absorption edge wavelength of the film using spectra produced by the spectrometer.

Another aspect of the invention provides a system for determining an optical absorption edge of a semiconductor film having a measurable optical absorption edge deposited on a material having no measurable optical absorption edge. The system includes a substrate of material having no measurable optical absorption edge, a film of a semiconductor material having a measurable optical absorption edge and a measurable thickness deposited on the substrate, and a depositor for depositing the film on the substrate. The system also includes a light source for interacting light with the film deposited on the substrate, a detector for collecting diffusely scattered light from the film, and a spectrometer for producing a spectra from the diffusely scattered light. The system further includes a software program for determining a temperature of the film at the film thickness as a function of the film thickness and the optical absorption edge wavelength of the film using spectra produced by the spectrometer.

The invention provides a real-time measurement of a property having a dependence on film thickness, such as temperature of the film, when the film has a measurable optical absorption edge and the substrate has no measurable optical absorption edge. The invention takes advantage of the fact that the film is formed of a semiconductor material and thus provides a measurable optical absorption edge wavelength. By accounting for the dependence of the optical absorption edge wavelength of the film on the film thickness, the invention can provide a precise, real-time measurement of the temperature of the sample.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2 is a schematic view of a second exemplary thin film deposition process including the optical absorption edge measurement system according to the subject invention;

FIG. 13 is a dialog of the software program including a thickness value of a film.

DETAILED DESCRIPTION OF THE PREFERRED EMBODIMENT

Figure 1:
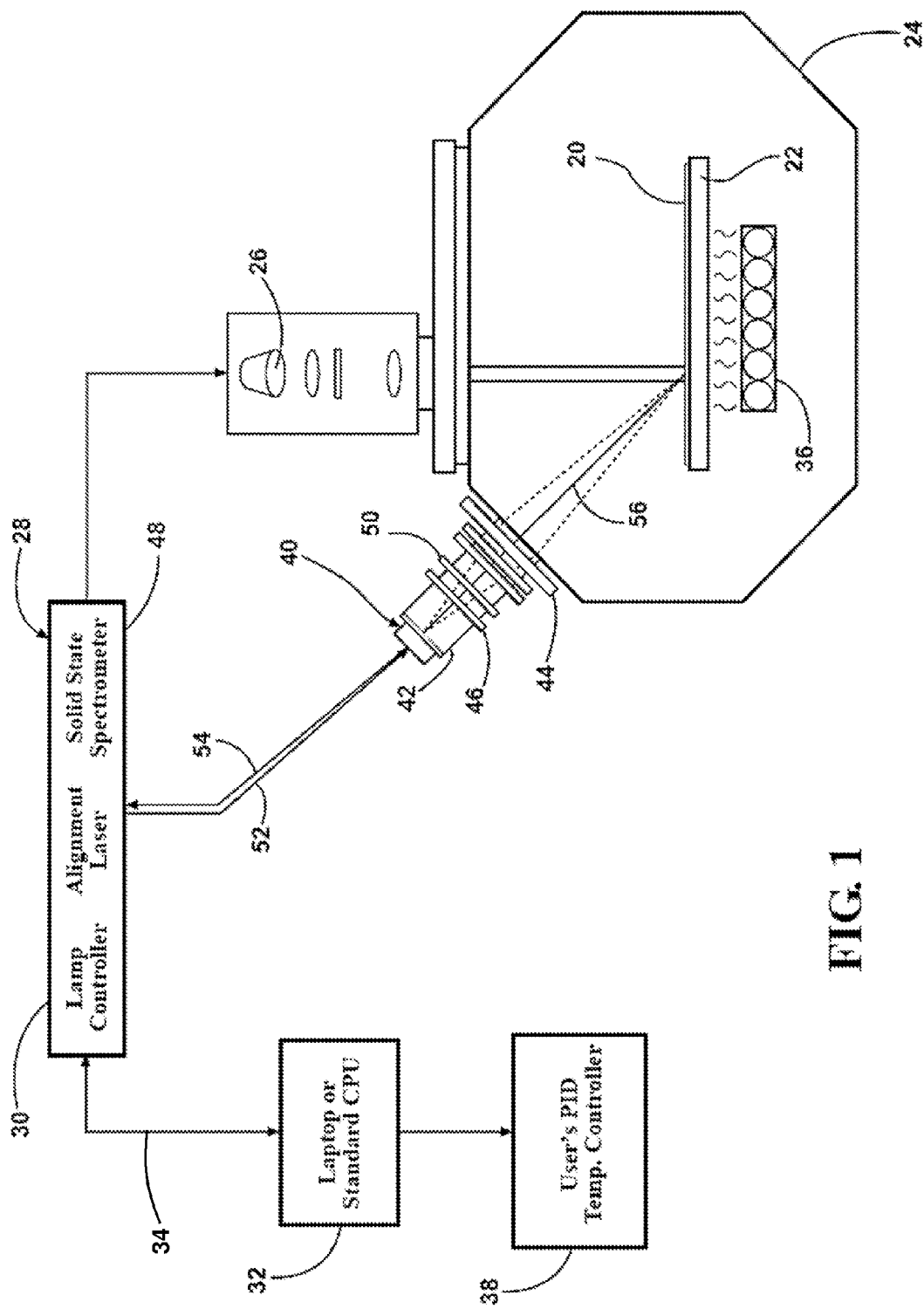
FIG. 1 is a schematic view of an exemplary thin film deposition process including an optical absorption edge measurement system according to the subject invention.

Referring to the Figures, wherein like numerals indicate corresponding parts throughout the several views, an exemplary application of the method, apparatus, and system for determining temperature of a sample including a semiconductor film 20 having a measurable optical absorption edge and a measurable thickness deposited on a substrate 22 having no measurable optical absorption edge is illustrated schematically in FIG. 1 within the context of a film 20 deposition process. FIG. 1 shows a sample within a deposition chamber 24. The sample includes a substrate 22, such as a sapphire wafer, and a film 20 of a semiconductor material, such as GaN (Gallium Nitride) being deposited on the substrate 22, such as sapphire, which is used as a component of blue and white light emitting diodes (LEDs).

The system of FIG. 1 includes a light source 26 for interacting light with the sample, including the film 20 deposited on the substrate 22, to produce diffusely scattered light. The light source 26 is typically a quartz halogen lamp, mounted outside the deposition chamber 24 which directs light toward the sample. The light provided by the light source 26 is electromagnetic radiation of any wavelength, both visible and not visible to the naked eye. A control unit 28 containing a lamp controller unit 30 is connected to the light source 26 by a light source power cable. A computer 32, such as a laptop or standard central processing unit, employing a software program simultaneously monitors and operates the lamp controller unit 30 and other components of the system. The computer 32 is connected to the control unit 28 by a USB cable 34.

In the application of FIG. 1, the system includes a heat source 36, which heats the substrate 22 and film 20 from behind as the substrate 22 is rotated about a center axis and the film 20 is deposited on the substrate 22. Although not shown, the light source 26 and the heat source 36 may be the same component. The temperature of the sample must be monitored and controlled as variations in temperature ultimately affect quality and composition of the film 20 deposited on the substrate 22. The system includes a temperature control 38, such as a PID temperature control 38, which is connected to the computer 32 and can be manually operated by a user of the system.

As discussed in detail below, the light diffusely scattered from the sample is analyzed to determine the optical absorption edge wavelength of the film, which is used to determine the temperature or other properties of the sample. The optical absorption edge can also be referred to as the band edge or band gap. The system includes a detector 40 for collecting diffusely scattered light from the film 20. The detector 40 is typically an Si-based detector 40. The detector 40 includes a housing 42, which is also mounted outside the deposition chamber 24 proximate to a transparent view port at an angle that is non-specular to the light source 26. The detector 40 includes an adjustable tilt mount 44 comprising a micrometer-actuated, single-axis tilt mechanism built into the front of the detector 40 to assist in pointing the detector 40 at the sample within the chamber 24. The detector 40 also includes focusing optics 46 assisting in the collection of the diffusely scattered light.

The system includes a spectrometer 48, such as a solid state spectrometer 48 or an array spectrometer 48, for producing a spectra from or based on the diffusely scattered light from the film and collected by the detector 40. The optical absorption edge wavelength of the film is determined based on the spectra. The step of determining the optical absorption edge wavelength of the film 20 based on the spectra includes accounting for the semiconductor material and the thickness of the film 20, as discussed below.

The system includes an optical fiber unit 50, including a first optical fiber 52 coupled to the spectrometer 48 and a second optical fiber 54 running collinear to first optical fiber 52 and coupled to a visible alignment laser 56 for aid in alignment of the detector 40. The optical components are optimized, using appropriate optical coatings, for either infrared or visible operation depending on the characteristics of the sample being measured. The computer 32 is connected to the alignment laser 56 and the spectrometer 48 by the USB cable 34. The software program is employed to control the alignment laser 56 and spectrometer 48.

The system can include a single apparatus for determining the optical absorption edge of the semiconductor film 20 having a measurable optical absorption edge deposited on the substrate 22 having no measurable optical absorption edge. The single apparatus includes the detector 40 for collecting diffusely scattered light from the film 20 deposited on the substrate 22, the spectrometer 48 for producing the spectra from the diffusely scattered light, and the software program for determining an optical absorption wavelength of the film 20 as a function of the film thickness based on the spectra provided by the spectrometer 48. The software program can also determine the temperature of the film 20 as a function of film thickness and optical absorption edge wavelength using the spectra produced by the spectrometer 48, which will be discussed further below.

The system typically includes a depositor or a means for depositing the film 20 on the substrate 22. The means for depositing the film 20 on the substrate 22 can include a chemical vapor deposition process such as metalorganic vapor phase epitaxy (MOVPE), a molecular deposition process such as molecular beam epitaxy (MBE), or other thin-film deposition process such as sputtering.

FIG. 2 illustrates a second exemplary application of the method, apparatus, and system for determining an optical absorption edge of a semiconductor film 20 having a measurable optical absorption edge deposited on a substrate 22 of material having no measurable optical absorption edge within the context of a film 20 deposition process. FIG. 2 shows a substrate provided as a flexible steel sheet, which is provided as a roll of material. The sheet is unrolled and transported along or across a conveyor as the film 20 is deposited on the substrate 22. A plurality of clasps 58 maintain the substrate 22 in place as the film 20 is deposited.

As stated above, many new applications are emerging which require precise real-time monitoring of the thin film properties, such as temperature, during thin film deposition on a substrate 22 formed of a material that does not absorb light and thus has no measurable optical absorption edge. The substrate 22 is a non-semiconductor and is typically transparent to all practical wavelengths of light. One example of the substrate 22 material is sapphire ($Al_2O_3$), which is used to form blue and white LEDs, as discussed with regard to the application of FIG. 1. Other examples of substrate 22 material having no measurable optical absorption edge include $SiO_2$, glass, amorphous SiC, or metals such as thin rolled steel, Cu, Al, Mo, and Ta.

The film 20 deposited on the substrate 22 of these emerging applications is formed of a semiconductor material having a measurable optical absorption edge and a measurable thickness. The optical absorption edge is measured according to methods discussed herein, and the thickness can be measured by a variety of methods, as discussed below. Examples of the semiconductor material of the film 20 include GaN and InGaN, which can be deposited on the sapphire substrate and used to form the LED. Another example of the semiconductor material of the film 20 is CdTe. Manufacturers of the LEDs formed of sapphire substrates 22 and GaN films 20 typically require the substrate 22 to maintain a nearly constant temperature, including a 1.0° C. or less deviation, when the film 20 is being deposited on the substrate 22. The temperature of the film 20 deposited on the sapphire substrate 22 is determined from the optical absorption edge wavelength of the sample, as described below.

Monitoring the temperature of the sample including a film 20 formed of a semiconductor material deposited on a substrate 22 formed of a non-semiconductor material using the prior art kSA BandiT system and method, as described in US Publication No. 2005/0106876 and U.S. Publication No. 2009/0177432, typically produces inaccurate results.

The general dependence of the absorption of light by a semiconductor material is provided by Equation 1 below.

$$I(d)/I(0)=1-\exp(-\alpha d) \quad \text{Equation 1}$$

wherein d is the thickness of the film 20, I(d) is the intensity of the diffusely scattered light collected from the film 20 at the film thickness (d), I(0) is the intensity of diffusely scattered light collected from the substrate 22 without the film 20, and $\alpha$ is the absorption coefficient of the material of the film 20 at the band gap energy of the material. The absorption coefficient of the material ($\alpha$) accounts for the dependence of the optical absorption on the band gap energy of the material, which is temperature-dependent. The absorption coefficient ($\alpha$) is also referred to as $\alpha(h\nu)$ in the equation given above: $\alpha(h\nu)=\alpha_g \exp[(h\nu-E_g)/E_0]$.

Equation 1 illustrates that the optical absorption of the film 20 is thickness-dependent and the behavior of the optical absorption is exponential. In applications wherein the substrate 22 has no measurable optical absorption edge wavelength, light diffusely scatters from the surfaces of the thin film 20, the interface between the film 20 and the thick substrate 22, and the surfaces of the substrate 22, like substrates formed of semiconductor materials. However, for substrates 22 formed of semiconductor materials, the light is affected by the substrate 22, which has a large thickness, so the incremental changes in the thickness have virtually no effect on the optical absorption edge wavelength. However, when the substrate 22 is formed of a material having no measurable optical absorption edge wavelength, such as a non-semiconductor, the light is not affected by the substrate 20. The substrate 22 is typically either transparent (e.g. glass or sapphire) or completely reflective (e.g. steel or other metal). Thus, the light is only affected by the semiconductor film 20. Since the film 20 is thin, the incremental increases or changes in the film thickness have a significant effect on the measured optical absorption edge wavelength of the film 20. An incremental change or increase in the film thickness is typically a 1.0 µm increase or decrease in thickness.

The prior art system and method do not adequately account for the thickness of the semiconductor material, which in this case is the thin film 20, rather than the thick substrate 22, when determining the temperature of the sample. It has been determined that the inaccurate temperature measurements obtained using the kSA BandiT system of the prior art are due to incremental changes in the thickness of the film 20 being deposited on the substrate 22, and not accounting for the optical absorption edge wavelength dependence on thickness when determining the temperature of the film 20.

Figure 3A:
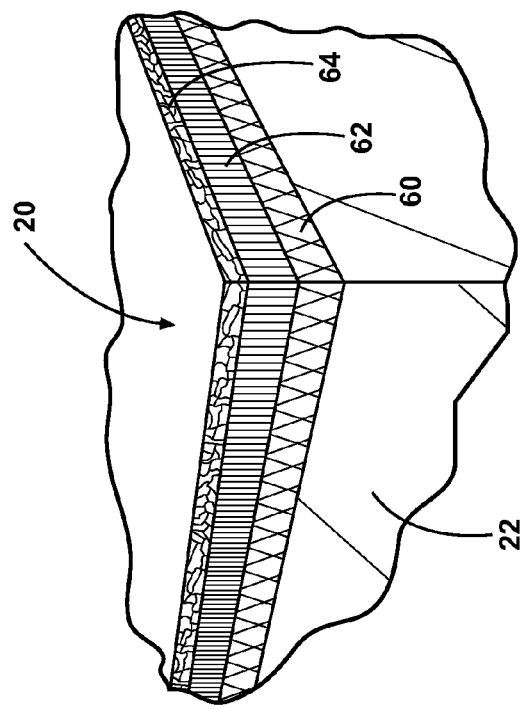
FIG. 3A is an enlarged view of a section of the film and substrate of FIG. 3.
Figure 3:
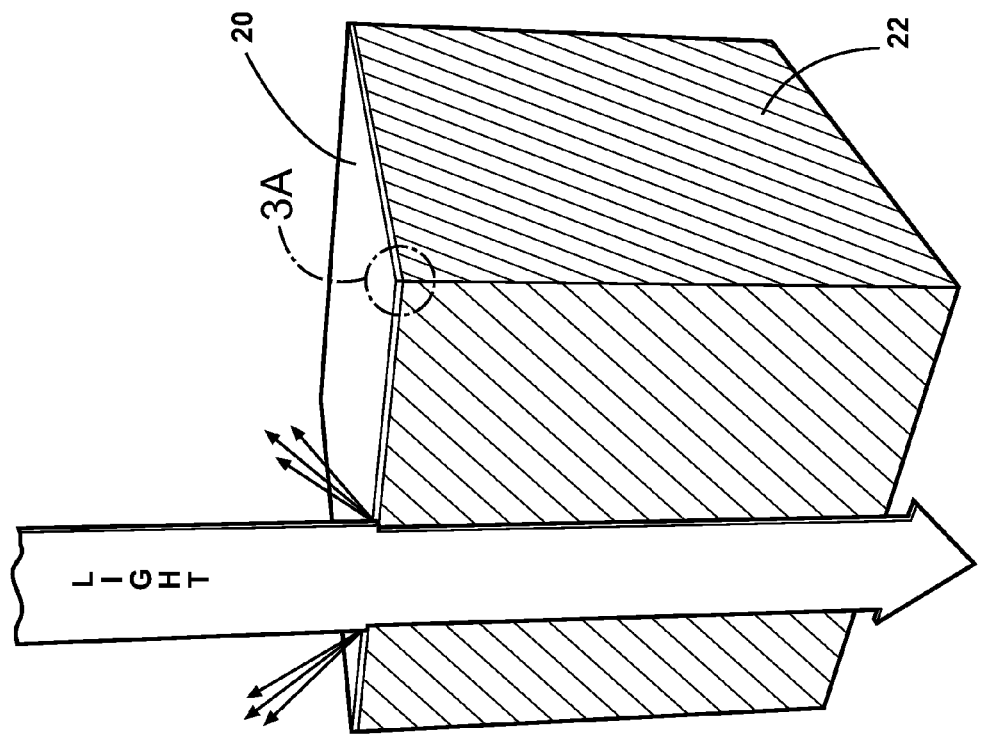
FIG. 3 is a fragmented perspective and cross sectional view of a film including three layers deposited on a substrate.

In one embodiment, as shown in FIG. 3A, the film 20 includes three layers 60, 62, 64 deposited on a substrate 22 of sapphire. The substrate 22 has a thickness of about 600 μm. The base layer 60 deposited on the substrate 22 includes undoped GaN and includes a thickness of about 1.0 μm to about 2.0 μm. The middle layer 62 deposited on the base layer 60 is doped GaN and includes a thickness of about 0.5 μm to about 1.0 μm. The top layer 64 deposited on the middle layer 62 is InGaN and includes a thickness of about 0.2 μm to about 0.5 μm. The temperature of the top layer 64 while it is being deposited on the substrate 22 and during processing is especially crucial to the quality of the LED product because the top layer 64 produces the active layer of a multiple quantum well. The temperature of the top layer 64 affects the color of the light emitted from the LED product, and even slight temperature variations, such as +/−5.0° C. will yield noticeable differences in the light color of the LED product. As alluded to above and shown in FIG. 3, the light diffusely scatters from the top and bottom surfaces of each of the layers 60, 62, 64 of the film 20. The prior art kSA BandiT system and method, as described in US Publication No. 2005/0106876 and U.S. Publication No. 2009/0177432, which doesn't accurately account for the thickness of the film 20, produces inaccurate results for the temperature of the sample in FIG. 3.

Figure 4:
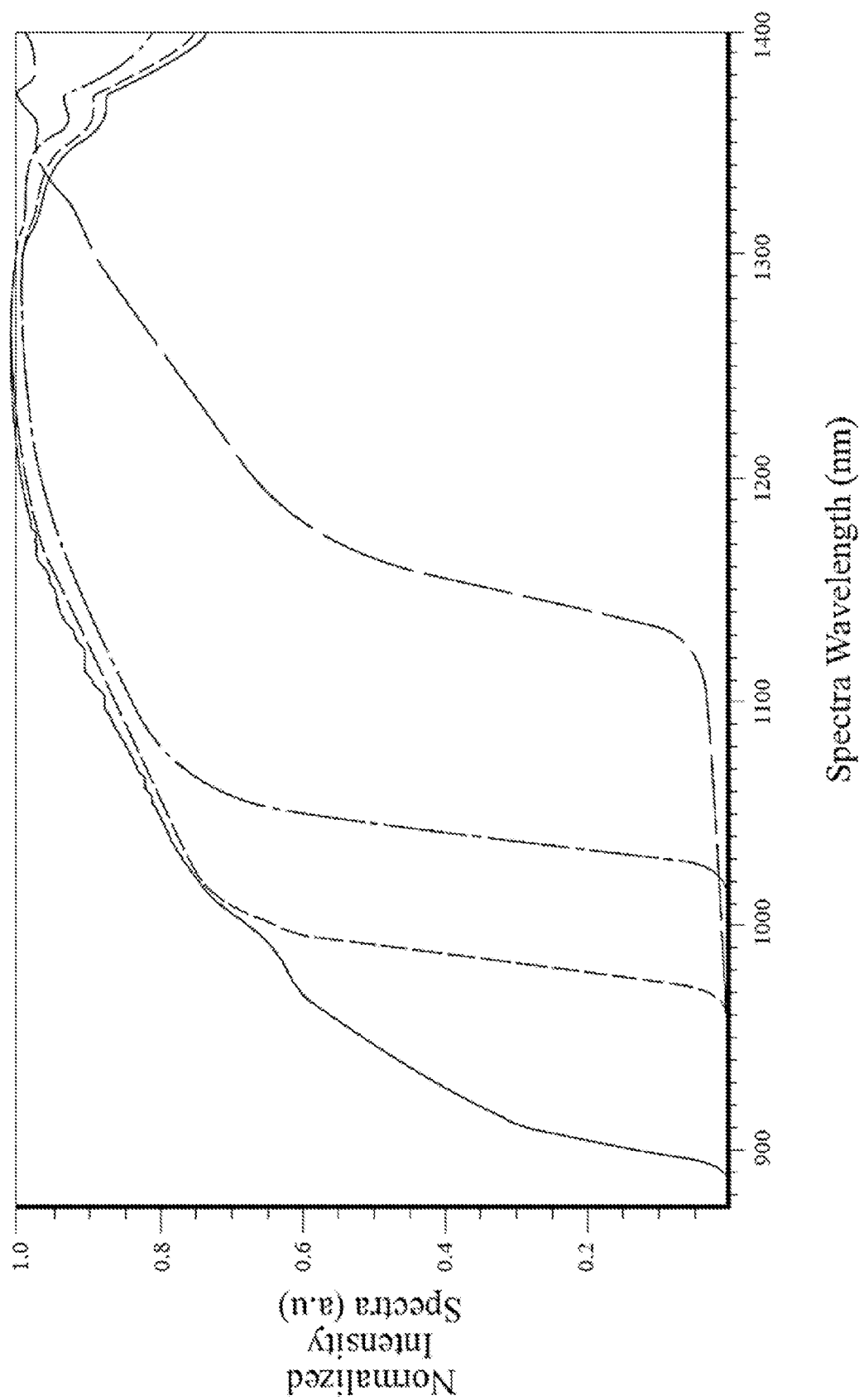
FIG. 4 is a plot of intensity versus wavelength and includes a plurality of spectra obtained as a single thin film of semiconductor material deposited on a substrate formed of non-semiconductor material at a constant temperature.
Figure 5:
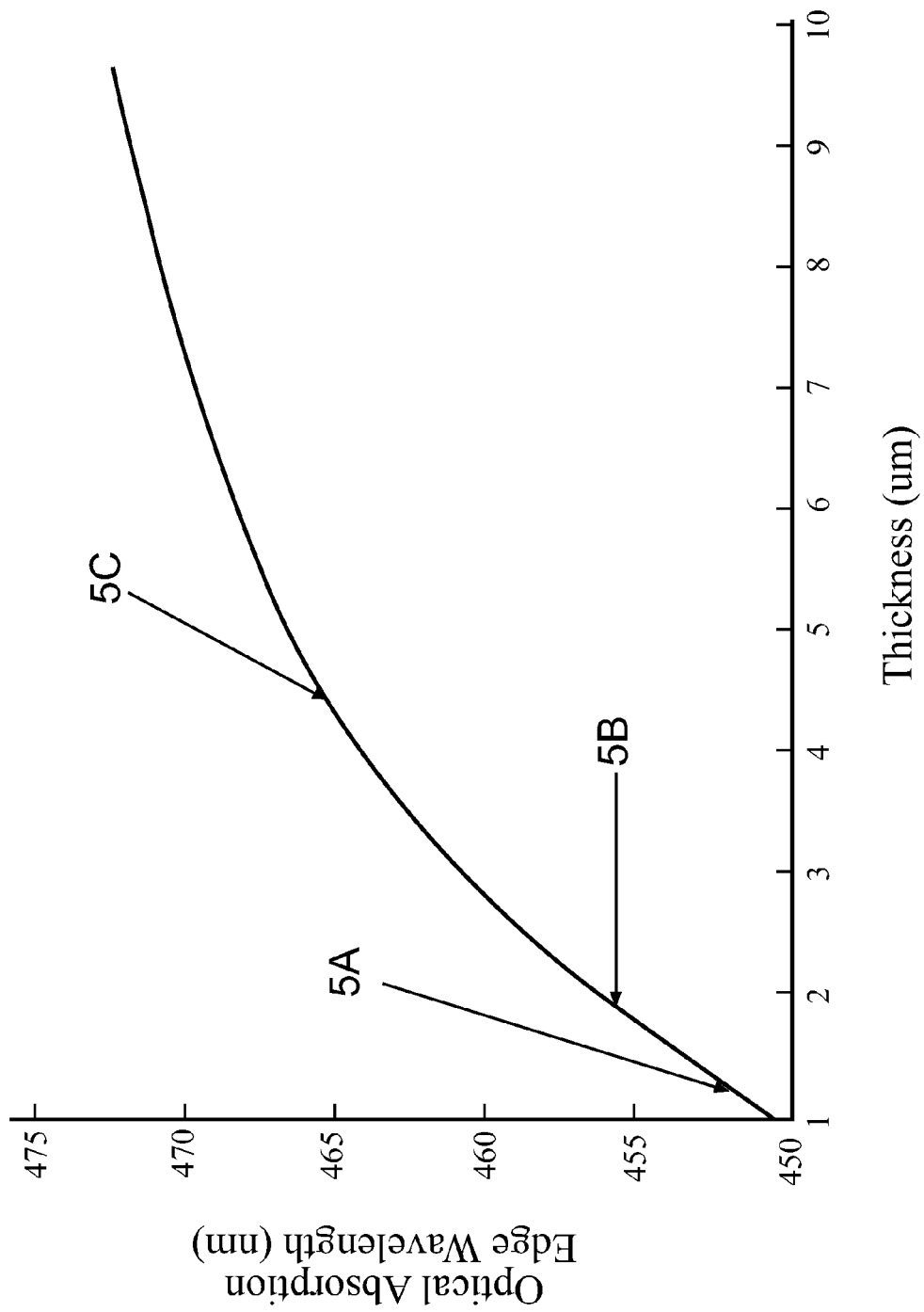
FIG. 5 is a plot of the optical absorption edge wavelength versus thickness of a film at a constant temperature.
Figure 5C:
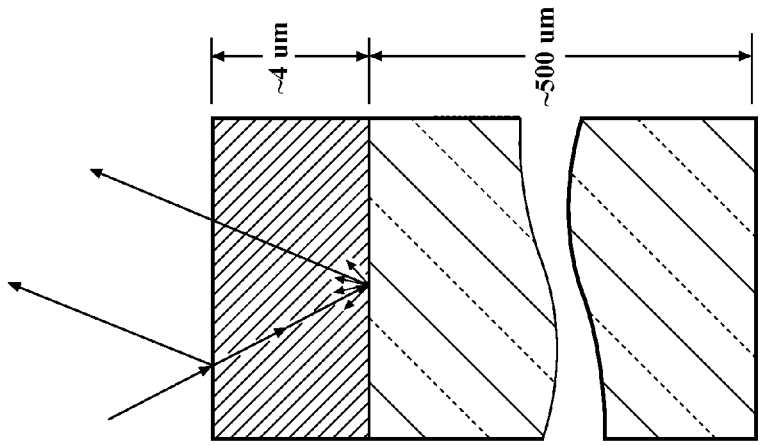
FIGS. 5A-C represent exemplary cross-sections of thin film and substrate at progressive times in a deposition process and corresponding generally to the references 5A, 5B and 5C along the plot of FIG. 5, and further showing changes in diffusely scattered light as a function of film thickness.
Figure 5B:
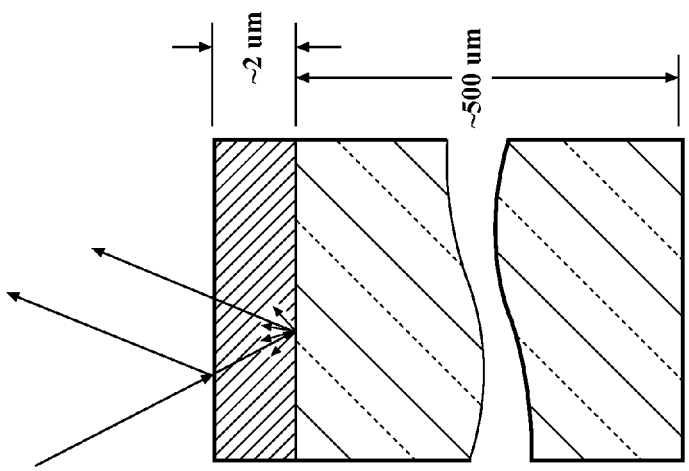
Figure 5A:
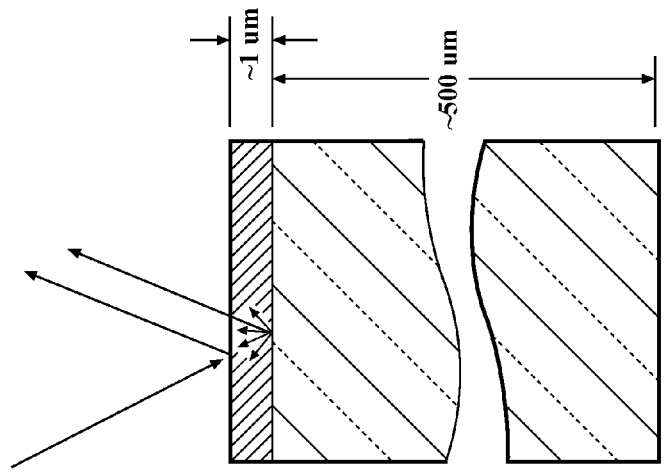

FIG. 4 explains how error and inaccurate results could occur when not accurately accounting for the incremental change in the thickness of the film 20. FIG. 4 is a plot of intensity versus wavelength and includes several spectra obtained as a single thin film 20 of semiconductor material is deposited on the substrate 22 formed of non-semiconductor material at a constant temperature. Although the sample is maintained at the constant temperature, the single sample produces spectra having different optical absorption edge wavelengths at each thickness. FIG. 5 is a plot of the optical absorption edge wavelengths of the sample of FIG. 4 as the deposited film 20 increases in thickness at a constant temperature. The prior art method would provide results indicating a different temperature at each incremental change in the thickness of the film 20, which is not accurate.

The method, apparatus, and system of the present invention account for the incremental changes in the thickness of the film 20 by determining the optical absorption edge wavelength of the film 20 as a function of the film thickness, which is then used to determine temperature of the film 20. The optical absorption edge wavelength and temperature are determined at a time during the manufacturing process when adjustments can be made to the film 20 to correct undesirable temperatures which indicate undesirable properties.

Figure 6:
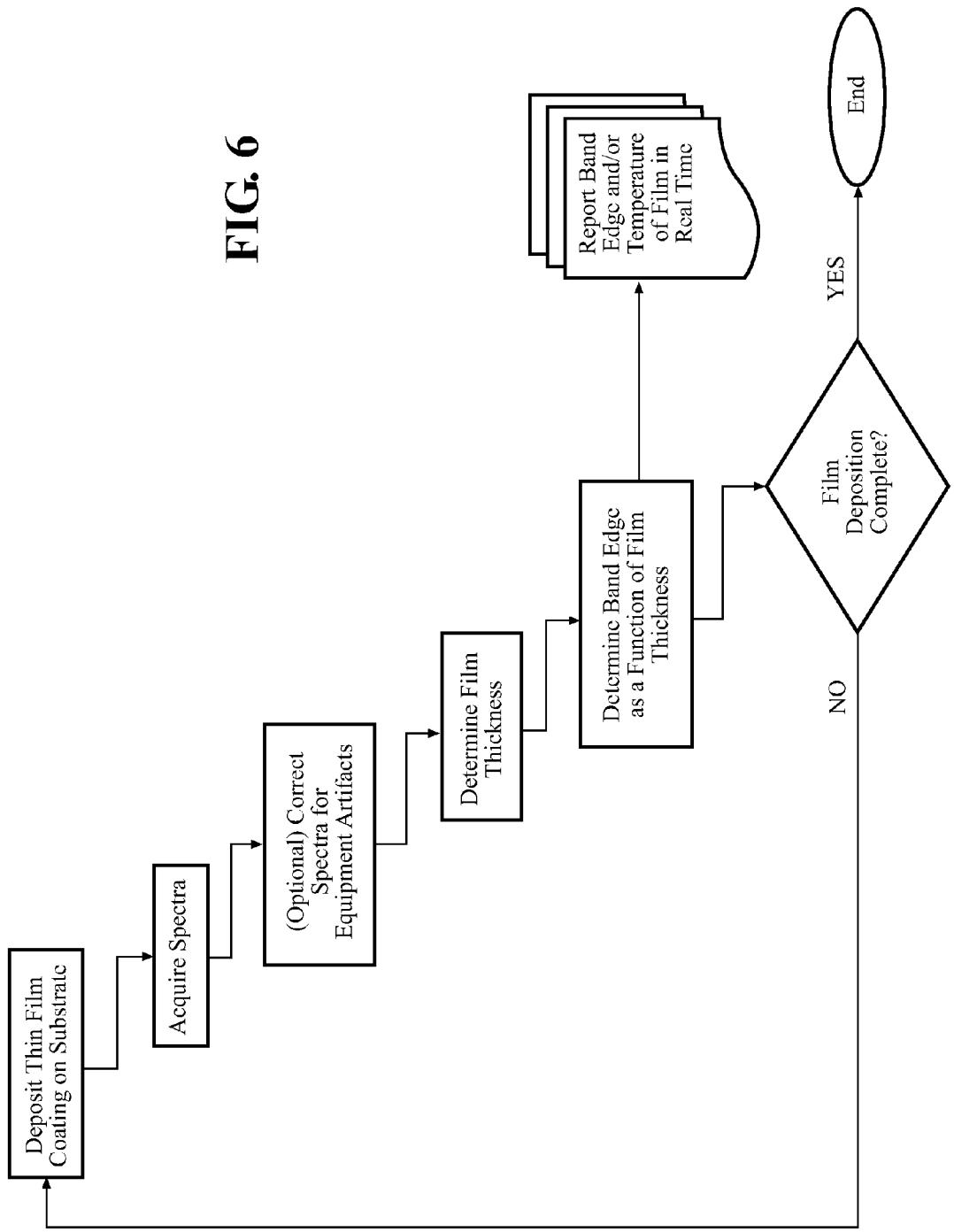
FIG. 6 is a simplified flow chart describing the process steps of the optical absorption edge measurement method according to one embodiment of the subject invention.

As alluded to above, and shown in the flow chart of FIG. 6, the method includes depositing the film 20 of a semiconductor material having a measurable optical absorption edge and a measurable thickness on the substrate 22, heating the substrate 22 and the film 20, and interacting light signals with the film 20 deposited on the substrate 22 to produce diffusely scattered light. The method next includes producing a spectra indicating optical absorption of the film 20 based on the diffusely scattered light from the film 20. The method also includes determining a thickness of the film 20, determining the optical absorption edge wavelength of the film 20, and determining the temperature of the film at the film thickness as a function of the film thickness and the optical absorption edge wavelength.

The first step includes performing a spectra acquisition to correct potential errors due to equipment artifacts, such as a non-uniform response of the Si-based detector 40 used for 350 nm to 600 nm spectroscopy and non-uniform output light signals of Tungsten-Halogen lamps in the same wavelength range. These errors could prevent raw diffuse reflectance light signals from yielding a measurable optical absorption edge at the correct wavelength position. When performing the spectra acquisition, it can be assumed the errors are steady-state.

Figure 7:
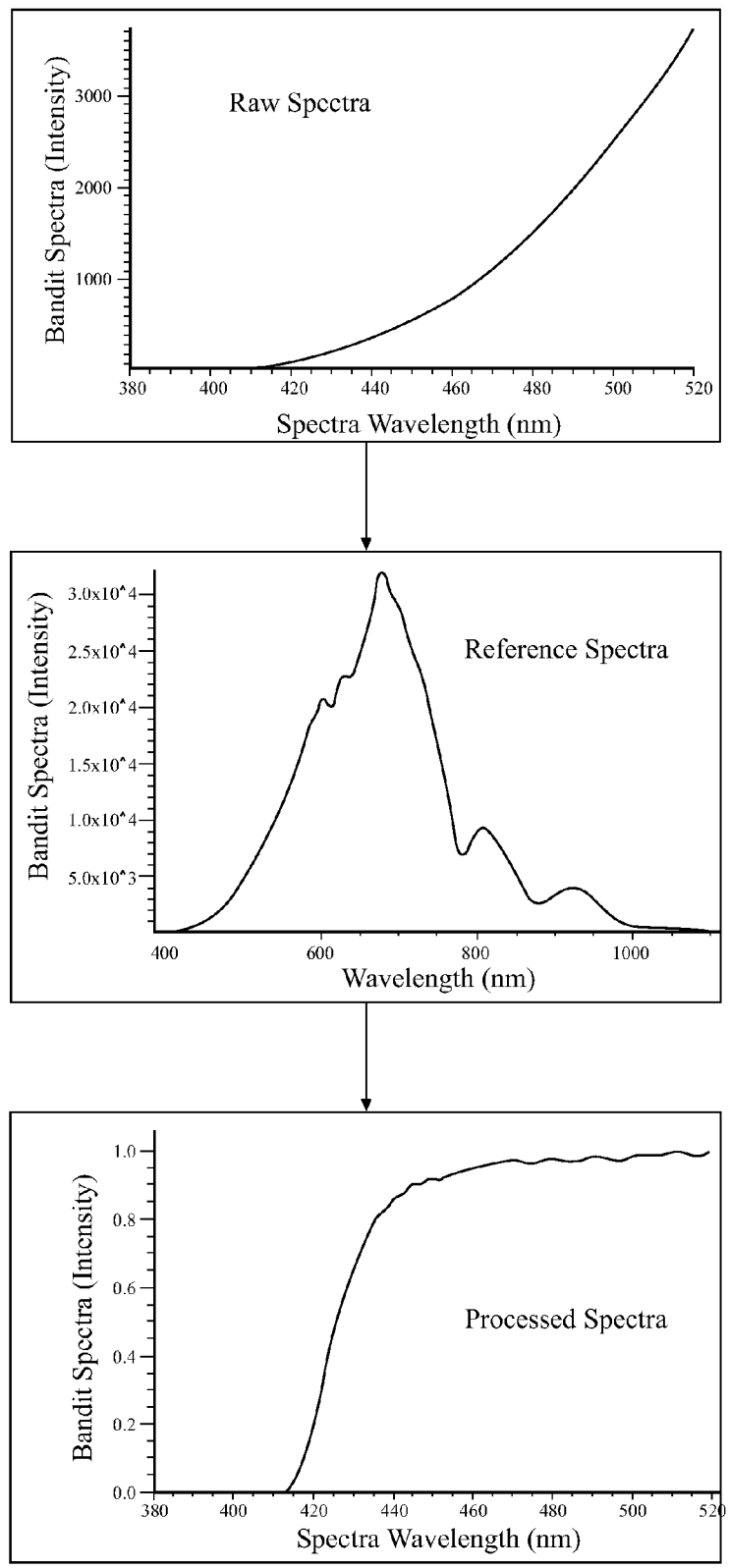
FIG. 7 illustrates an example of the spectra produced during the spectra acquisition step.

The spectra acquisition first includes producing a reference spectra representing the overall response of the system, i.e. the combination of lamp output signature and detector 40 response, which are both wavelength dependent. The reference spectra, shown in FIG. 7, is produced by interacting light with the substrate 22 without the film 20, for example bare sapphire, and collecting any of the diffusely scattered light in the detector 40. Next, the spectrometer 48 is used to generate the reference spectra based on the diffusely scattered light collected from interacting light with the substrate 22 alone. The spectra acquisition concludes by normalizing the reference spectra.

Each time a raw spectra is produced based on the diffusely scattered light from the film, the method includes normalizing the raw spectra and dividing the normalized raw spectra by the normalized reference spectra to produce a resultant spectra, as shown in FIG. 7. Dividing the raw spectra by the reference spectra is performed on every incoming raw spectra, and is necessary to determine an accurate film thickness, in addition to enhancing the optical absorption edge signature. The resultant spectra is normalized and used to determine the optical absorption edge wavelength. The resultant spectra provides a resolvable optical absorption edge wavelength, which is used to determine the temperature or another property of the film 20.

The spectra acquisition, including creating a normalized reference spectra, is performed each time a component of the system changes. For example, a view port of the detector 40 can become coated over time, which affects the collected light. The spectra acquisition can be performed one time per run, one time per day, one time per week, or at other time intervals, as needed. Performing the spectra acquisition one time per run will typically provide more accurate results than once per week.

The spectra of the present method and system, including the reference spectra, raw spectra, and resultant spectra are typically produced by resolving the light signals from the substrate 22 into discrete wavelength components of particular light intensity. The spectra indicates the optical absorption of the film 20 based on the diffusely scattered light from the film 20. The spectra typically includes a plot of the wavelength versus intensity of the light, as shown in the Figures. However, the spectra can provide the optical absorption information in another form, such as a table.

The resultant spectra are used to determine an optical absorption edge wavelength. As discussed in US Publication No. 2005/0106876 and U.S. Publication No. 2009/0177432, the optical absorption edge wavelength is the abrupt increase in degree of absorption of electromagnetic radiation of a material at a particular wavelength. The optical absorption edge wavelength is dependent on the specific material, the temperature of the material, and the thickness of the material. The optical absorption edge wavelength can be identified from the spectra; it is the wavelength at which the intensity sharply transitions from very low (strongly absorbing) to very high (strongly transmitting). For example, the optical absorption edge wavelength of the processed spectra of FIG. 7 is about 425 nm. The optical absorption edge wavelength is used to determine the temperature of the substrate 22.

The method includes producing a wavelength versus temperature calibration table (temperature calibration table) of a film 20 at a single thickness. The temperature calibration table can also be provided to a user of the method, rather than produced by the user of the method. The temperature calibration table indicates the optical absorption edge wavelength versus temperature at a constant thickness of the film. The temperature calibration table provides subsequent temperature measurements of the film based on the optical absorption edge wavelength obtained from the spectra. However, unlike in the prior art system and method, the present system and method further includes determining the temperature of the film 20 by accounting for the effect of the thickness of the film 20 on the optical absorption edge wavelength, or the dependence of the optical absorption edge wavelength on film thickness, which will be discussed further below.

As stated above, the method and system of the present invention includes determining the optical absorption edge of the film 20 as a function of the film 20 thickness because the optical absorption edge wavelength of the film 20 is dependent on the thickness of the film 20. The film thickness has an especially significant impact on the optical absorption edge of thin films 20, and thus the determination of the temperature of the thin films 20, such as the top layer 64 of the sample of FIGS. 3a and 3b, including a thickness of about 0.2 µm to about 0.5 µm.

Figure 8:
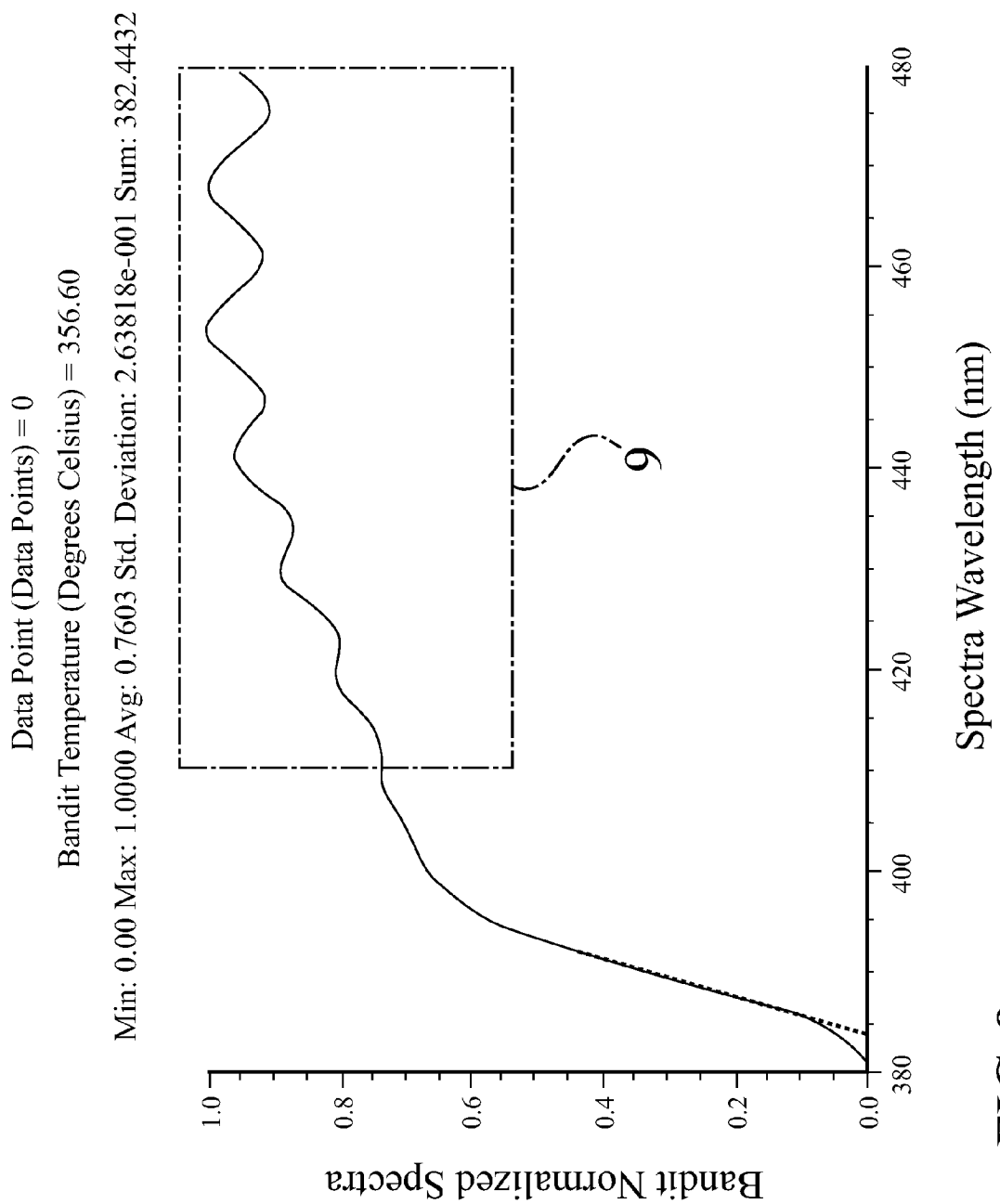
FIG. 8 includes an example spectra and identifies oscillations employed to determine film thickness.
Figure 9:
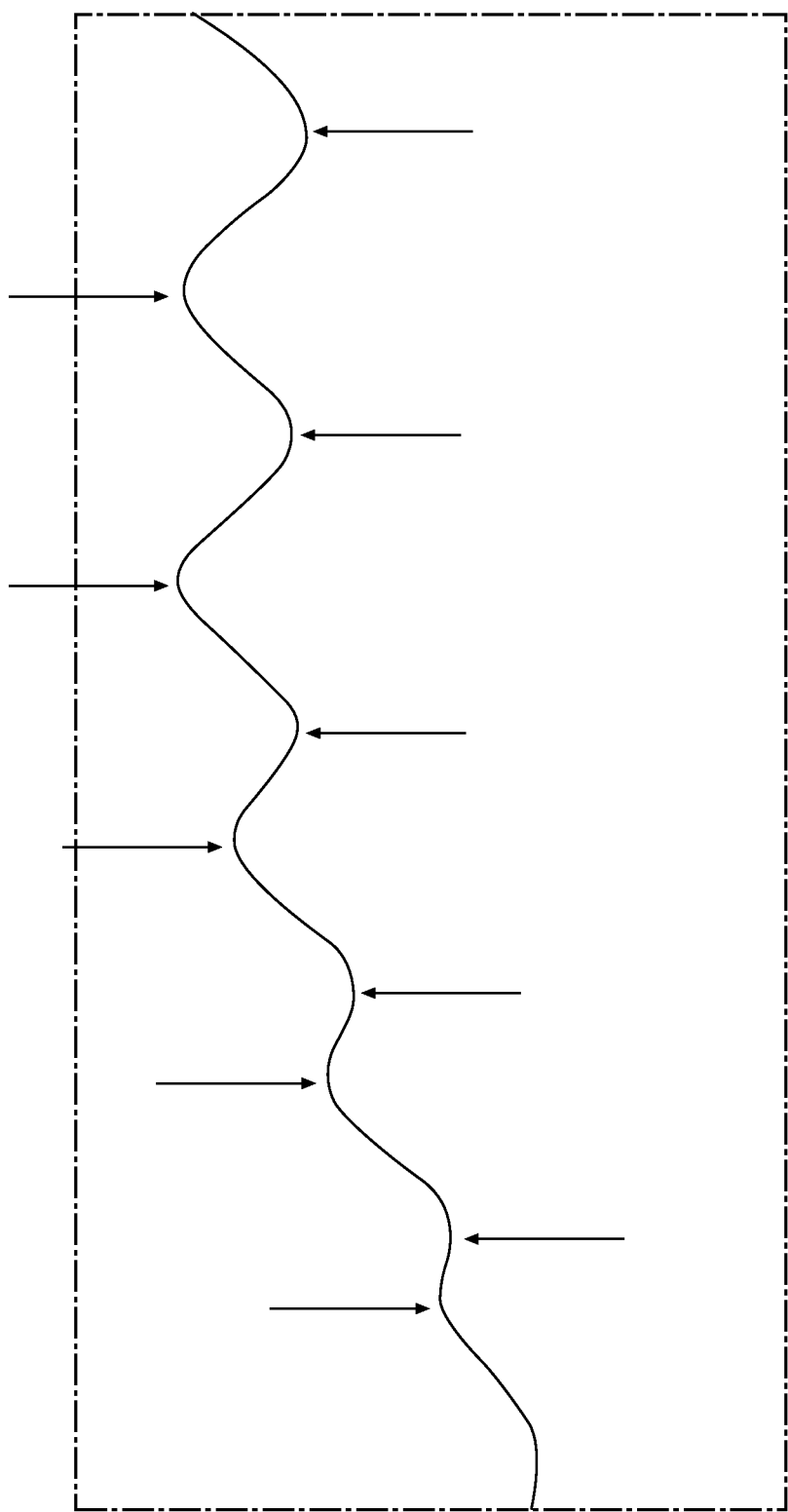
FIG. 9 is an enlarged view of the oscillations of FIG. 8.

The thickness of the film 20 can be determined by a variety of methods. In one embodiment of the invention, the thickness of the film 20 is conveniently determined from the spectra produced by the light diffusely scattered from the film 20 and used to determine the optical absorption edge wavelength, discussed above. As shown in FIGS. 8 and 9, the spectra includes oscillations below (to the right of) the optical absorption edge region of the spectra. The oscillations are a result of thin film interference, which is similar to interference rings observable on a thin film of oil. A derivative analysis of the wavelength-dependent peaks and valleys of the oscillations is employed to determine the thickness of the film 20. Equation 2 below can be employed to determine the thickness of the film 20, $$d = \frac{1}{2(n_1/\lambda_1 - n_2/\lambda_2)} \quad \text{Equation 2}$$

wherein d is the thickness of the film, $\lambda_1$ is the wavelength at a first peak of the oscillations and $\lambda_2$ is the is the wavelength at a second peak of the oscillations adjacent the first peak, or alternatively $\lambda_1$ is the wavelength at a first valley of the oscillations and $\lambda_2$ is the wavelength at a second valley of the oscillations adjacent the first valley, $n_1$ is a predetermined index of refraction dependent on the material of semiconductor at $\lambda_1$, and $n_2$ is a predetermined index of refraction dependent on the material of semiconductor at $\lambda_2$. As shown in FIG. 9, the wavelengths used for $\lambda_1$ and $\lambda_2$ can be any two successive peaks or any two successive valleys of the oscillations. The oscillations and value obtained for thickness of the film 20 have a non-linear dependence on all layers 60, 62, 64 of the film 20. The thickness of the film 20 can also be determined using other methods. For example, the thickness can be estimated based on previous measurements of thickness as a function of deposition time or by laser-based reflectivity systems such as the Rate Rat™ product available from k-Space Associates, Inc., Dexter, Mich. USA.

As stated above, the step of determining the optical absorption edge of the film 20 as a function of the film 20 thickness includes accounting for the dependence of the optical absorption of the film 20 on the film thickness. The step of determining the optical absorption edge of the film 20 as a function of the film thickness can also include adjusting a measured optical absorption edge wavelength value of the film 20 obtained from the spectra due to the step of depositing the film 20 of a semiconductor material having a measurable optical absorption edge and a measurable thickness on the substrate 22. The step of determining the optical absorption edge of the film 20 as a function of the film thickness can also include identifying the semiconductor material of the film 20 and adjusting a measured optical absorption edge wavelength value determined from the spectra based on the semiconductor material and the thickness of the film 20 to obtain an adjusted absorption edge wavelength.

The step of determining the optical absorption edge of the film 20 as a function of the film thickness typically includes using a thickness calibration table. Each semiconductor material has a unique thickness calibration table. The thickness calibration table indicates optical absorption edge wavelength versus thickness at a constant temperature of the film.

The thickness calibration table can be acquired by growing a film 20 of the semiconductor material at a constant temperature and measuring the optical absorption edge wavelength at each incremental increase in thickness to produce a spectra for each thickness. The thickness calibration table can also be prepared by depositing the film 20 on the substrate 22 at a constant temperature and measuring the optical absorption edge wavelength of the film 20 at the constant temperature and a plurality of thicknesses. Preparing the thickness calibration table at a constant temperature also allows a user to determine the dependence of the optical absorption edge wavelength on the thickness.

Figure 10:
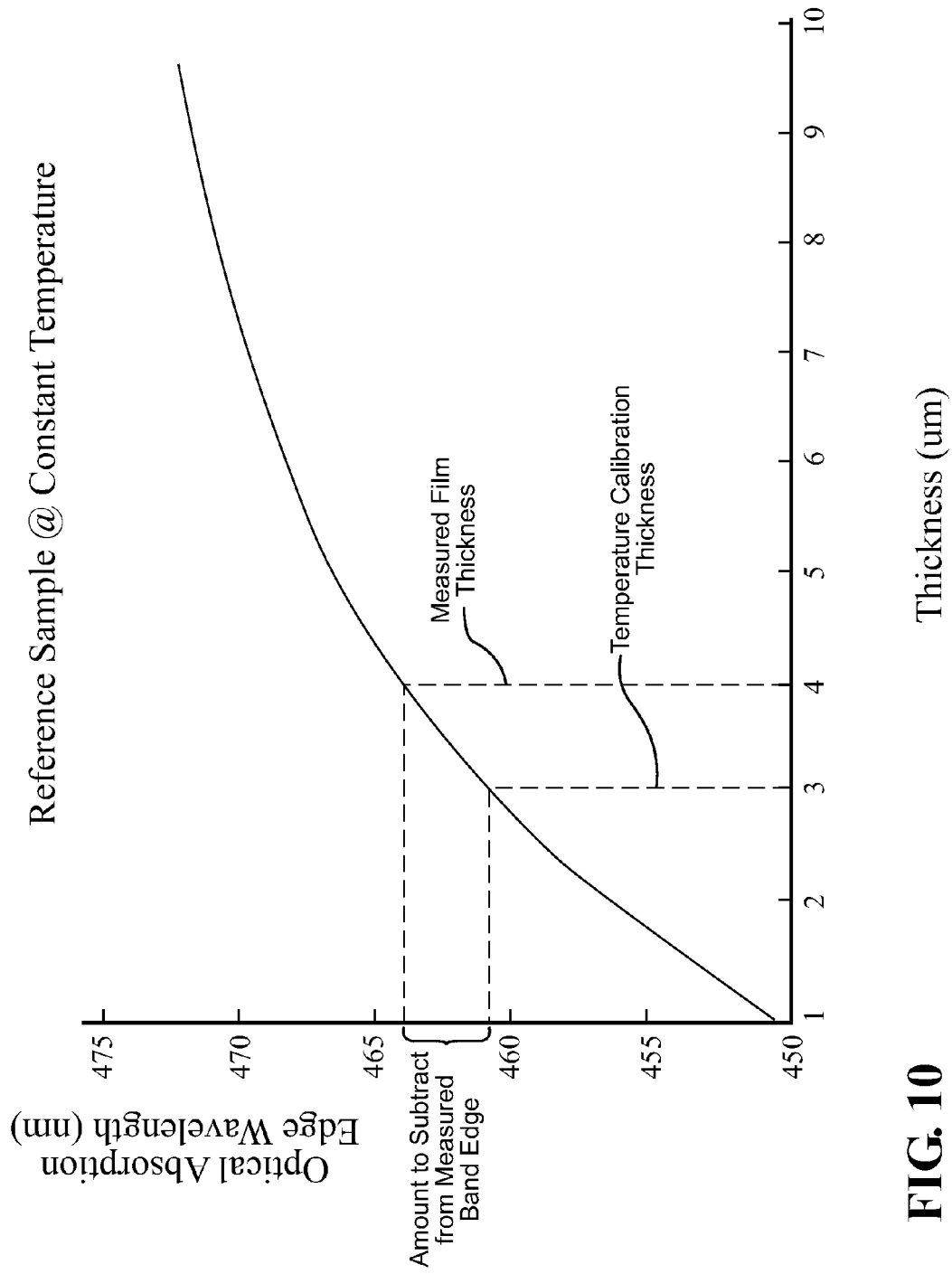
FIG. 10 is a plot of thickness versus optical absorption edge wavelength of a film.

The spectra acquisition is performed on each spectra, as described above. Next, from each of the spectra, a raw optical absorption edge wavelength value is determined for each thickness at the constant temperature. An $n^{th}$ order polynomial fit is performed on the raw optical absorption edge wavelength values to produce the optical absorption edge wavelength versus thickness curve of FIG. 10 (solid line), where n is the order of the polynomial providing the best fit to the data. This nth order polynomial dependence is used to create the thickness calibration table. The thickness calibration table is used as a thickness correction lookup up for subsequent temperature measurements. The thickness calibration table illustrates the dependence of the optical absorption edge wavelength on film thickness. As shown in the embodiment of FIG. 10, the optical absorption edge wavelength increases as the film thickness increases. The thickness calibration table is produced for each unique semiconductor material, as different materials produce different results. The thickness calibration table can also be provided to a user of the method, rather than produced by the user. However, for each unique material, only one thickness calibration table is needed to determine temperature of the film at various thicknesses and temperatures. The method can include identifying the semiconductor material of the film and providing the thickness calibration table and temperature calibration table for the identified semiconductor material. The temperature of the film at a certain thickness is determined based on the spectra, the thickness calibration table, and the temperature calibration table.

Example 1

In one embodiment, determining the temperature of a GaN film 20 on a sapphire substrate 22 includes first generating an optical absorption edge wavelength versus thickness calibration table or curve (thickness calibration table) for a GaN film 20, as shown in FIG. 10. Next, the method includes generating an optical absorption edge wavelength versus temperature calibration table (temperature calibration table) for a GaN film 20 at a single, predetermined thickness, for example 3.0 μm, using the kSA method disclosed in Publication No. 2005/0106876 and U.S. Publication No. 2009/0177432. The thickness calibration table at 3.0 μm and temperature calibration table is incorporated into the software program, which can be provided to a customer. The calibration tables are used to determine the temperature of a GaN film at other thicknesses. For example, the temperature of a film having a thickness of 4.0 μm is determined by producing a spectra at 4.0 μm. The optical absorption edge wavelength at 4.0 μm is determined from that spectra, for example 470 nm. However, unlike the prior art method, that measured optical absorption edge wavelength of 470 nm is not used to determine the temperature of the film. Rather, the present method includes referring to the thickness calibration table of FIG. 10 and determining the difference between the optical absorption edge wavelength at 4.0 μm and 3.0 μm, for example 3 nm, to obtain a wavelength difference. Next, the wavelength difference, 3 nm, is subtracted from the measured optical absorption edge wavelength of 470 nm to provide an adjusted or corrected optical absorption edge wavelength of 467 nm. The corrected or adjusted optical absorption edge wavelength of 467 nm is used to determine the temperature of the film at 4.0 μm, using the temperature calibration table. The method also includes re-determining the temperature of the film 20 at incremental thicknesses to detect changes in temperature due to the step of depositing the film on the substrate. The above steps can be performed in real-time at each incremental increase in film thickness, as the film is being deposited on a substrate. Since the monitoring and measuring is performed in real-time, any undesirable temperature or other property of the material can be corrected immediately to prevent harm in the quality of the product.

Example 2

The method of the present invention can be implemented in the software program installed in the computer 32 of the apparatus and system described above. The kSA BandiT system, discussed in US Publication No. 2005/0106876 and U.S. Publication No. 2009/0177432 can be modified to include the method of the present invention.

Figure 11:
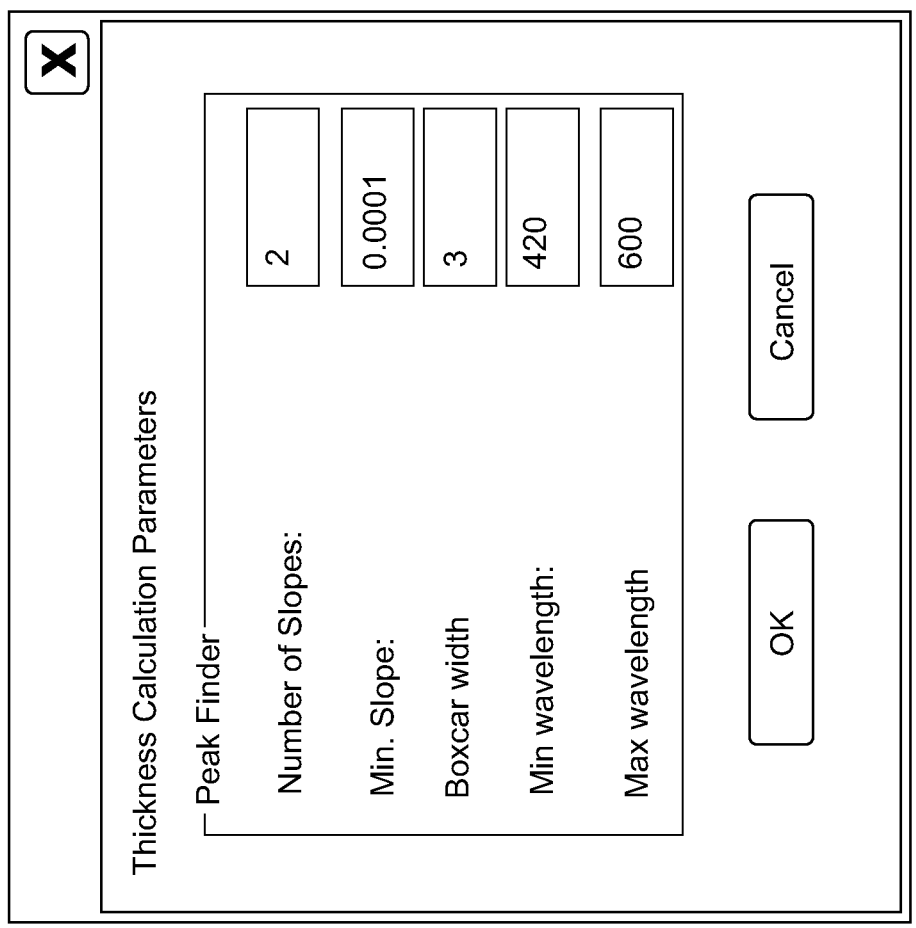
FIG. 11 is dialog of a software program employing one embodiment of the method of the subject invention illustrating thickness calculation.

The software program determines the film thickness using the spectra and Equation 2, discussed above. The step of determining the thickness of the film requires inputting several parameters, as shown in FIG. 11. The first parameter is the number of slopes, which is defined as the required number of slopes detected in succession that have at least the minimum slope defined by the user. The parameters also include minimum slope, which is defined as the minimum slope required to deem a peak or valley as real and not noise; boxcar width, which is defined as the amount of boxcar smoothing of the raw spectra; minimum wavelength, which is defined as the lowest wavelength of the spectra whereby the derivative analysis will be performed; and maximum wavelength, which is defined as the maximum wavelength of the spectra whereby the derivative analysis will be performed. The dialog of FIG. 11 allows a user to set the parameters for the peak and valley determination that is subsequently used in Equation 2.

Figure 12:
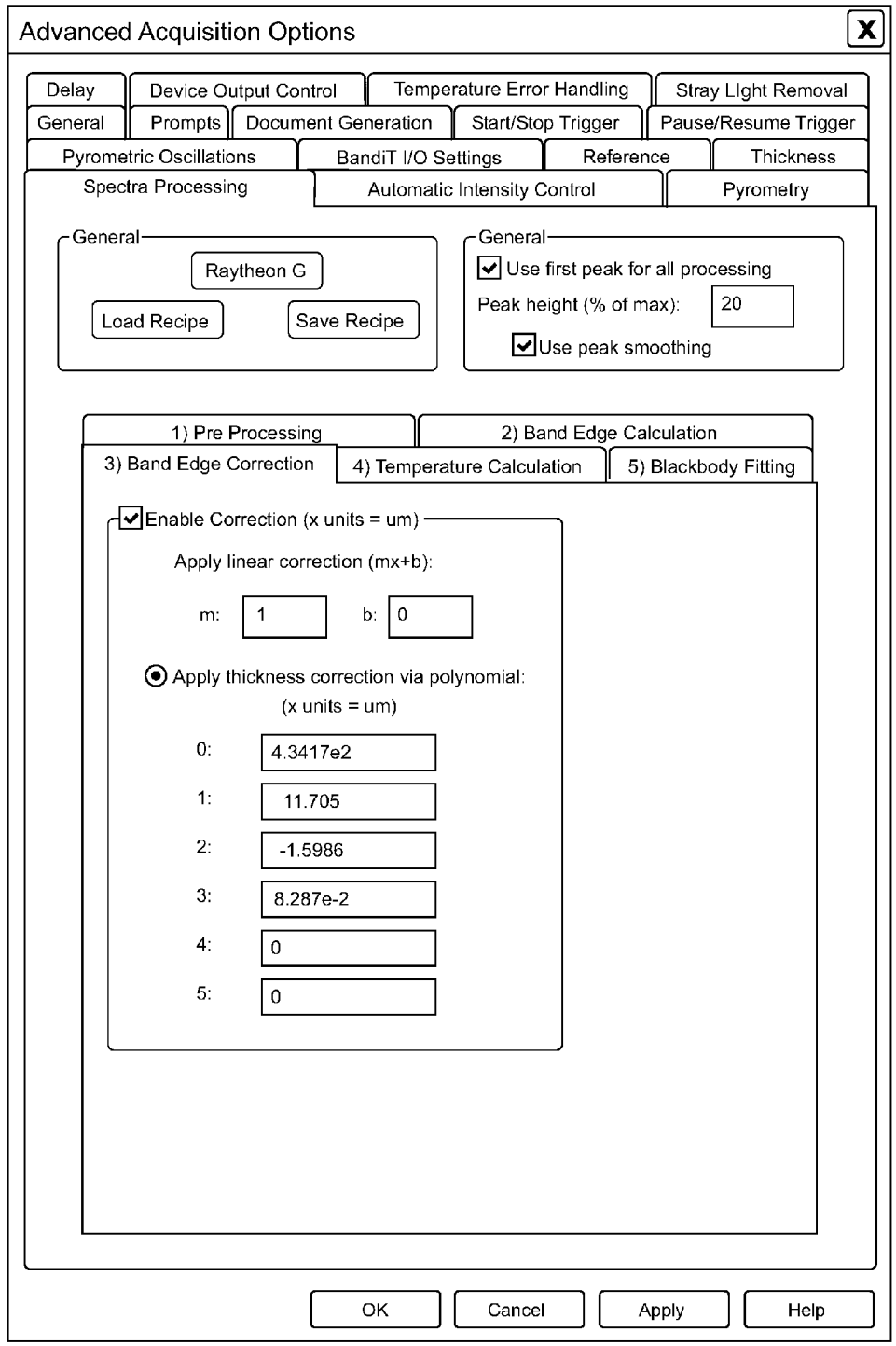
FIG. 12 is dialog of the software program employing one embodiment of the method of the subject invention.

The software program next determines the optical absorption edge wavelength as a function of the film thickness. The software program includes a "band edge correction" feature, as shown in the dialog of FIG. 12, which includes a thickness calibration table for the semiconductor material of the film 20. The software program also includes a temperature calibration table for the semiconductor of the film 20. The software program determines the optical absorption edge wavelength as a function of the film thickness using the calibration tables, as described above. The measured optical absorption edge wavelength is adjusted or corrected based on the calculated film thickness. The software program then employs the adjusted optical absorption edge wavelength to determine the temperature of the film 20, using the temperature calibration table and process of the prior art kSA BandiT system, described in US Publication No. 2005/0106876 and U.S. Publication No. 2009/0177432.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

| ELEMENT LIST | |
|---|---|
| Element Symbol | Element Name |
| 20 | film |
| 22 | substrate |
| 24 | chamber |
| 26 | light source |
| 28 | control unit |
| 30 | lamp controller unit |
| 32 | computer |
| 34 | USB cable |
| 36 | heat source |
| 38 | temperature control |
| 40 | detector |
| 42 | housing |
| 44 | adjustable tilt mount |
| 46 | focusing optics |
| 48 | spectrometer |
| 50 | optical fiber unit |
| 52 | first optical fiber |
| 54 | second optical fiber |
| 56 | laser |
| 58 | clasps |
| 60 | base layer |
| 62 | middle layer |
| 64 | top layer |

What is claimed is:

1. A method for determining temperature of a semiconductor film having a measurable optical absorption edge deposited on an optically transparent substrate material having no measurable optical absorption edge, said method comprising the steps of:
   a) providing an optically transparent substrate of material having no measurable optical absorption edge,
   b) depositing a film of a semiconductor material having a measurable optical absorption edge and a measurable thickness on the substrate,
   c) interacting light with the film deposited on the substrate to produce diffusely scattered light,
   d) collecting the diffusely scattered light from the film,
   e) producing a spectra indicating optical absorption of the film based on the diffusely scattered light from the film,
   f) determining a thickness of the film, g) determining the optical absorption edge wavelength of the film based on the spectra, and
h) determining a temperature of the film at the film thickness as a function of the film thickness and the optical absorption edge wavelength.

2. The method of claim 1 wherein said step h) includes accounting for the dependence of the optical absorption of the film on the film thickness.

3. The method of claim 1 including re-determining the temperature of the film at incremental thicknesses to detect changes in temperature due to said step b).

4. The method of claim 1 including providing a temperature calibration table indicating optical absorption edge wavelength versus temperature at a constant thickness of the film, providing a thickness calibration table indicating optical absorption edge wavelength versus thickness at a constant temperature of the film, and
wherein said step h) includes determining a difference between an optical absorption edge wavelength at the thickness determined by said step f) and the optical absorption edge wavelength at the thickness of the temperature calibration table using the thickness calibration table to obtain a wavelength difference,
subtracting the wavelength difference from the optical absorption edge wavelength determined by said step g) to provide an adjusted optical absorption wavelength value, and
using the adjusted optical absorption wavelength value to determine the temperature of the film at the thickness determined by said step f).

5. The method of claim 4 wherein said step of providing the temperature calibration table and said step of providing the thickness calibration table includes identifying the semiconductor material of the film and providing the tables for the identified semiconductor material.

6. The method of claim 1 wherein said step g) includes accounting for the semiconductor material and the thickness of the film.

7. The method of claim 1 wherein at least one of said step g) and said step h) includes employing the following equation:

$$I(d)/I(0) = 1 - \exp(-\alpha d)$$

wherein d is the thickness of the film, I(O) is the intensity of diffusely scattered light collected from the substrate without the film, a is the absorption coefficient of the semiconductor, and I(d) is the intensity of the diffusely scattered light collected from the film at the film thickness (d).

8. The method of claim 1 including adjusting the thickness of the film and re-determining the temperature of the film at the adjusted thickness.

9. The method of claim 1 wherein said step h) includes determining the dependence of the optical absorption edge wavelength of the film on the film thickness.

10. The method of claim 9 wherein the step of determining the dependence of the optical absorption edge wavelength on the thickness includes preparing an optical absorption edge versus thickness calibration table at a constant temperature.

11. The method of claim 10 wherein said step of preparing a thickness calibration table includes depositing the film on the substrate at a constant temperature and measuring the optical absorption edge wavelength of the film at the constant temperature and a plurality of thicknesses.

12. The method of claim 1 including normalizing the spectra.

13. The method of claim 12 wherein said step of normalizing the spectra includes:

i) interacting light with the substrate prior to step b) to produce diffusely scattered light,
j) collecting the diffusely scattered light from the substrate of step i),
k) producing a reference spectra based on the diffusely scattered light from the substrate of step j),
l) normalizing the reference spectra of step k),
m) dividing the normalized spectra of claim 12 by the normalized reference spectra of step l) to produce a resultant spectra, and
n) normalizing the resultant spectra of step m).

14. The method of claim 13 wherein said step m) includes employing oscillations of the spectra of claim 12 below the optical absorption edge region of the spectra.

15. The method of claim 14 including the step of employing a derivative analysis of the oscillations.

16. The method of claim 14 wherein said step m) includes employing the following equation:

$$d = \frac{1}{2(n_1/\lambda_1 - n_2/\lambda_2)}$$

where d is the thickness of the film, $\lambda_1$ is the wavelength at a first peak of the oscillations and $\lambda_2$ is the wavelength at a second peak of the oscillations adjacent to the first peak or $\lambda_1$ is the wavelength at a first valley of the oscillations and $\lambda_2$ is the wavelength at a second valley of the oscillations adjacent to the first valley, $n_1$ is a predetermined index of refraction dependent on the material of semiconductor at $\lambda_1$, and $n_2$ is a predetermined index of refraction dependent on the material of semiconductor at $\lambda_2$.

17. The method of claim 1 wherein said step g) includes determining the optical absorption edge wavelength as a function of the film thickness and band gap energy of the semiconductor material.

18. The method of claim 1 wherein said step b) includes using at least one of a chemical vapor deposition process, a molecular deposition process and a sputtering process.

19. The method of claim 1 wherein said step b) includes transporting the substrate along a conveyor as the film is being deposited.

20. An apparatus for determining an optical absorption edge of a semiconductor film having a measurable optical absorption edge deposited on an optically transparent material having no measurable optical absorption edge comprising:
a detector for collecting diffusely scattered light from a film of a semiconductor material having a measurable optical absorption edge and a measurable thickness after it has been deposited on an optically transparent substrate of material having no measurable optical absorption edge,
a spectrometer for producing a spectra from the diffusely scattered light, and
a software program for determining a temperature of the film as a function of film thickness and optical absorption edge wavelength of the film using spectra produced by the spectrometer.

21. A system for determining an optical absorption edge of a semiconductor film having a measurable optical absorption edge deposited on an optically transparent material having no measurable optical absorption edge comprising:
a substrate of optically transparent material having no measurable optical absorption edge, a film of a semiconductor material having a measurable optical absorption edge and a measurable thickness deposited on said substrate, a means for depositing the film on said substrate, a light source for interacting light with said film deposited on said substrate, a detector for collecting diffusely scattered light from said film, a spectrometer for producing a spectra from the diffusely scattered light, and a software program for determining a temperature of the film as a function of film thickness and optical absorption edge wavelength using spectra produced by the spectrometer.

22. A system as set forth in claim 21 wherein said substrate includes aluminum oxide ($Al_2O_3$) and said film includes gallium nitride (GaN).

* * * * *